(12) United States Patent
Bolken et al.

(10) Patent No.: US 6,531,763 B1
(45) Date of Patent: Mar. 11, 2003

(54) INTERPOSERS HAVING ENCAPSULANT FILL CONTROL FEATURES

(75) Inventors: Todd O. Bolken, Meridian, ID (US); David J. Corisis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 122 days.

(21) Appl. No.: 09/639,395

(22) Filed: Aug. 15, 2000

(51) Int. Cl.$^7$ ................................ H01L 23/28
(52) U.S. Cl. .................. 257/667; 257/783; 257/784; 257/787; 174/260; 438/118; 438/126; 264/272.17
(58) Field of Search .................... 361/767; 257/667, 257/778, 784, 787, 783; 438/112, 124, 126, 127, 118; 264/272.17; 174/260

(56) References Cited

U.S. PATENT DOCUMENTS

| | | |
|---|---|---|
| 4,617,730 A | 10/1986 | Geldermans et al. ......... 29/843 |
| 4,648,179 A | 3/1987 | Bhattacharyya et al. ...... 29/832 |
| 4,788,767 A | 12/1988 | Desai et al. ............... 29/830 |
| 5,086,558 A | 2/1992 | Grube et al. ............... 29/832 |
| 5,258,648 A | 11/1993 | Lin ........................ 257/778 |
| 5,384,955 A | 1/1995 | Booth et al. ............... 29/830 |
| 5,777,391 A * | 7/1998 | Nakamura et al. .......... 257/737 |
| 5,956,605 A | 9/1999 | Akram et al. .............. 438/613 |
| 6,002,180 A * | 12/1999 | Akram et al. .............. 257/782 |
| 6,157,080 A * | 12/2000 | Tamaki et al. ............. 257/738 |

* cited by examiner

Primary Examiner—Albert W. Paladini
Assistant Examiner—John B. Vigushin
(74) Attorney, Agent, or Firm—Dorsey & Whitney LLP

(57) ABSTRACT

Interposers having an encapsulant fill control feature are disclosed. In one embodiment, an interposer includes a substrate having a first surface proximate the semiconductor component, and a fill control feature projecting from the first surface toward a region adapted to be occupied by a semiconductor component. The fill control feature is positioned between the region and the substrate and is sized to at least partially block an opening between a semiconductor component that may be positioned in the region and the first surface. As an encapsulant material is flowed about the semiconductor component, the fill control feature at least partially blocks the encapsulant material from entering the opening. The encapsulant material may then substantially surround the semiconductor component, after which the encapsulant material may substantially fill a space between the semiconductor component and the interposer.

75 Claims, 7 Drawing Sheets

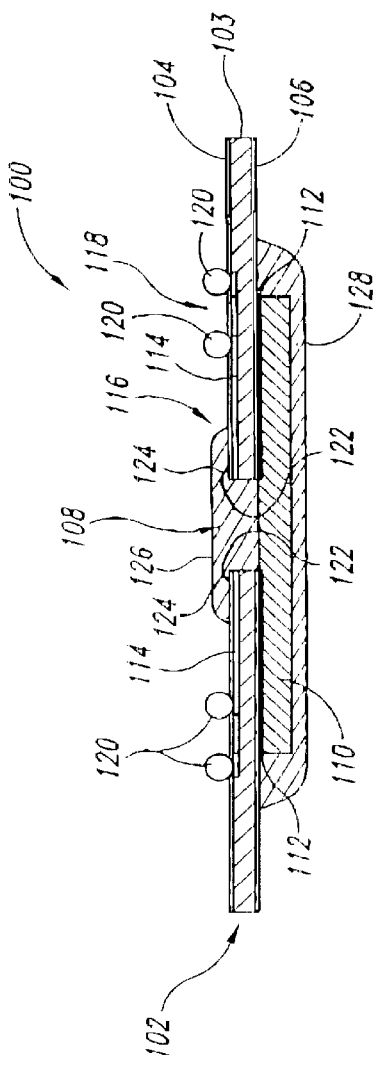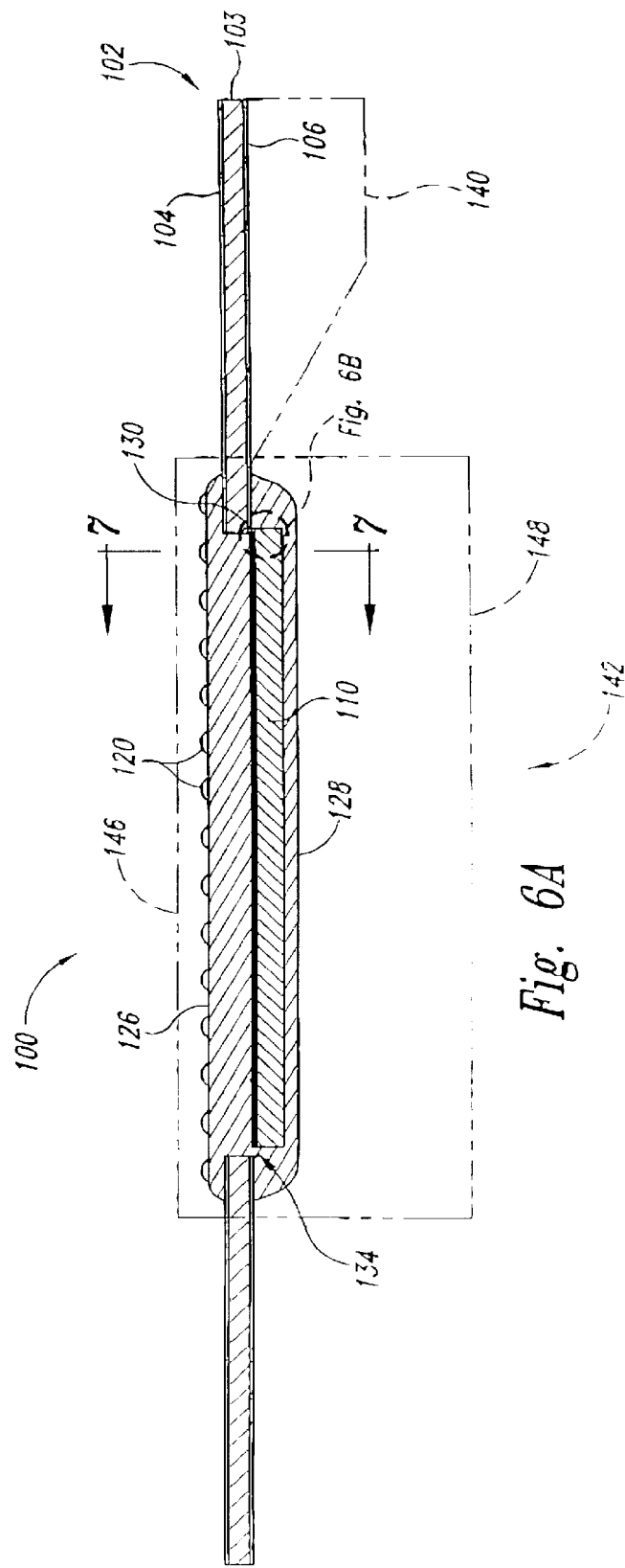

US 6,531,763 B1

INTERPOSERS HAVING ENCAPSULANT FILL CONTROL FEATURES

TECHNICAL FIELD

The present invention relates to apparatus and methods of semiconductor component packaging using interposers having an encapsulant fill control feature.

BACKGROUND OF THE INVENTION

Semiconductor chips (or die) may be mounted to circuit boards or other electronic components in several ways. In a typical ball grid array (BGA) or fine ball grid array (FBGA) assembly 30 as shown in FIG. 1, a die 10 is attached to an interposer 22 having a plurality of conductive leads 18. The die may be attached to the interposer using, for example, strips of adhesive 12 (see FIG. 1), an adhesive layer (e.g. epoxy), eutectic bonding, or other suitable methods. Typically, the die 10 includes a plurality of conductive terminals 14 (or bond pads) that are electrically coupled to corresponding contact pads 16 on the interposer 22, thereby coupling the internal circuitry of the die 10 with the conductive leads 18. The conductive terminals 14 may be attached to the contact pads 16 in a variety of ways, including by bond wires 26 (see FIG. 1), solder reflow, conductive adhesives, or other suitable methods. The conductive leads 18 of the interposer 22 fan out from the die 10 and may be coupled to other electronic components, such as printed circuit boards, electronics modules, and the like. Solder balls 24 (FIG. 1) may be attached to the ends of the conductive leads 18 for attaching the interposer 22 to other electronic components. Electrical signals may then be transmitted from, for example, a circuit board through the conductive leads of the interposer to the die, and vice versa. Typical BGA assemblies are described, for example, in U.S. Pat. No. 5,086,558 to Grube et al, U.S. Pat. No. 5,258,648 to Lin, and U.S. Pat. No. 4,617,730, incorporated herein by reference.

As shown in FIG. 1, it is customary to provide one or more encapsulant layers 28 over the die 10, conductive terminals 14, contact pads 16, and other sensitive areas of the FBGA assembly 30. The encapsulant layer 28 hermetically seals the assembly, insulating and protecting the sensitive portions of the assembly from humidity, oxidation, and other harmful environmental elements. To reduce stresses that may be induced in the FBGA assembly 30 during thermal cycling, the encapsulant layer 28 may be composed of a soft, compliant polymeric material, such as silicone rubber or other castable elastomer having a relatively low modulus of elasticity. Alternate materials for the encapsulant material are described, for example, in U.S. Pat. No. 5,956,605 issued to Akram and Farnworth, incorporated herein by reference.

FIG. 2 is a side elevational cross-sectional view of the FBGA assembly 30 of FIG. 1 engaged with an encapsulant supplier 40 and a mold 42. The mold 42 includes a lower portion 46 and an upper portion 48. The lower and upper portions 46, 48 have inner surfaces that are spaced apart from the FBGA assembly 30 and are shaped to form the encapsulant layers 28 (FIG. 1). The encapsulant supplier 40 may be integrally formed with the upper half 48, as shown in FIG. 2, or may be a separate component.

After the FBGA assembly 30 is positioned within the mold 42, an encapsulant material 50 may be flowed through the encapsulant supplier 40. As it enters the mold 42, the flow of encapsulant material 50 may divide into a first stream 52 and a second stream 54. The first stream 52 may turn and flow over an outer portion of the die 10 between the die 10 and the upper half 48 of the mold 42. The second stream 54 may flow through an opening between the die 10 and the interposer 22 and into the space between the FBGA assembly 30 and the lower half 46 of the mold 42, surrounding the bond pads 14, the bond wires 26, and the contact pads 16.

Ideally, the first stream 52 substantially fills the space between the FBGA assembly 30 and the upper half 48 of the mold 42, and the second stream 54 substantially fills the space between the FBGA assembly 30 and the lower half 46 of the mold 42. After the fill procedure is complete, the encapsulant material 50 may be cured, such as by heating, cooling, or exposing the encapsulant material to curing agents, and the mold 42 may be removed. These operations are typically performed simultaneously on numerous FBGA assemblies that are joined together as a single unit along lateral edges of the interposers 22. After curing the encapsulant materials, the FBGA assemblies may be singulated into discrete packages.

One problem with the above-described FBGA assembly 30 is that the encapsulant material may not completely fill the space between the FBGA assembly 30 and the mold 42, particularly in the space surrounding the bond pads 14, the contact pads 16, and the bond wires 26. To provide good thermal conduction and mechanical strength, the space surrounding the bond pads 14, the contact pads 16, and the bond wires 26 should be void-free. Moisture or contaminants may collect in the voids, and may cause the die to come loose from the interposer, or may cause other malfunctions of the microelectronics package.

SUMMARY OF THE INVENTION

The present invention is directed to apparatus and methods of semiconductor component packaging using interposers having an encapsulant fill control feature. In one aspect, an interposer includes a substrate having a first surface proximate a region adapted to be occupied by a semiconductor component, and a fill control feature projecting from the first surface toward the region. The fill control feature is positioned at least partially between the region and the substrate and is sized to at least partially block an opening between a semiconductor component positioned within the region and the first surface. As an encapsulant material is flowed about the semiconductor component, the fill control feature at least partially diverts the encapsulant material from entering the opening. The at least partially diverted encapsulant material may then substantially surround the semiconductor component, after which the encapsulant material may substantially fill a space between the semiconductor component and the interposer. Because the fill control feature diverts a portion of the encapsulant material to cause the space surrounding the semiconductor component to substantially fill before the space between the semiconductor component and the interposer, the fill control feature may reduce the occurrence of voids and may otherwise improve the fill of the encapsulant material about the semiconductor component and the interposer.

In an alternate aspect, the semiconductor component may be attached to the interposer by a pair of adhesive strips, the opening being formed between the semiconductor component, the interposer, and the adhesive strips. Alternately, the semiconductor component may be attached to the interposer by a pair of conductive bumps, the opening being formed between the conductive bumps. In other aspects, the interposer may include a plurality of fill control features.

BRIEF DESCRIPTION OF THE DRAWINGS

FIG. 5 is an end cross-sectional view of the microelectronics assembly of FIG. 3 viewed along line 5—5.

FIG. 6A is a side cross-sectional view of the microelectronics assembly of FIG. 3 viewed along line 6A—6A.

DETAILED DESCRIPTION OF THE INVENTION

The present invention is generally directed to apparatus and methods of semiconductor component packaging using interposers having an encapsulant fill control feature. Many specific details of certain embodiments of the invention are set forth in the following description and in FIGS. 1–14 to provide a thorough understanding of such embodiments. One skilled in the art will understand, however, that the present invention may have additional embodiments, or that the present invention may be practiced without several of the details described in the following description. Although a variety of electronic components may be attached in accordance with the invention, to simplify the description to allow the reader to focus on the inventive aspects, several of the following embodiments of the invention are described in terms of a semiconductor die attached to an interposer.

Figure 1:
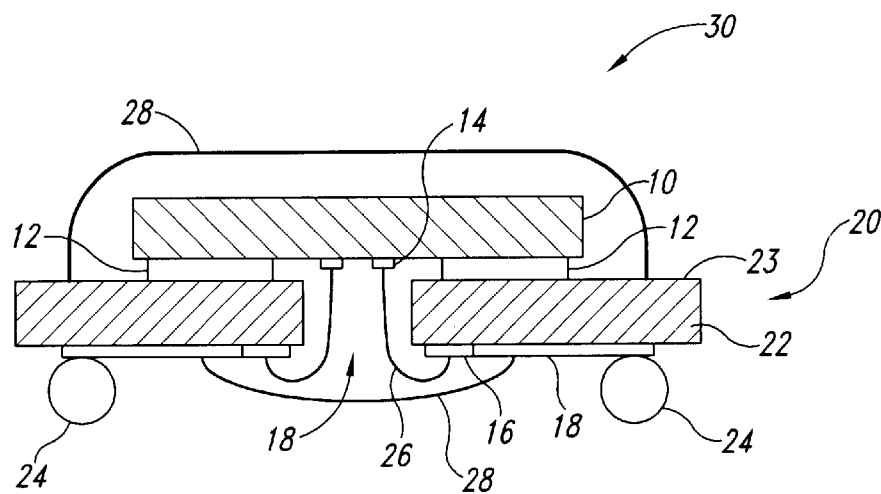
FIG. 1 is an end cross-sectional view of a "chip on board" assembly in according with the prior art.
Figure 2:
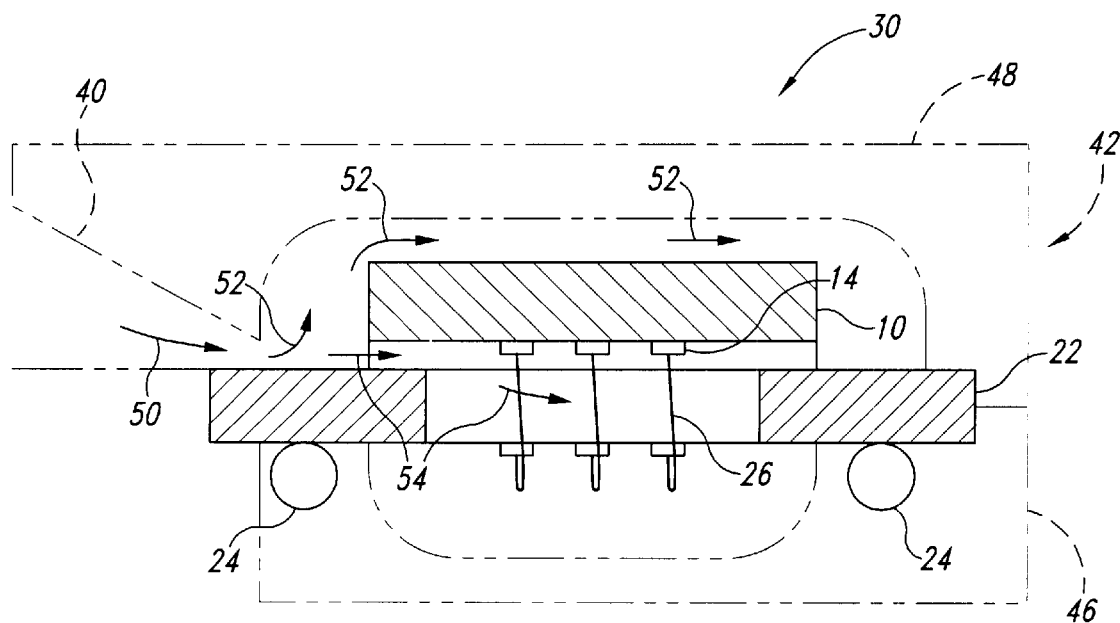
FIG. 2 is a side elevational cross-sectional view of the chip on board assembly of FIG. 1 engaged with an encapsulant supplier and a mold in accordance with the prior art.
Figure 3:
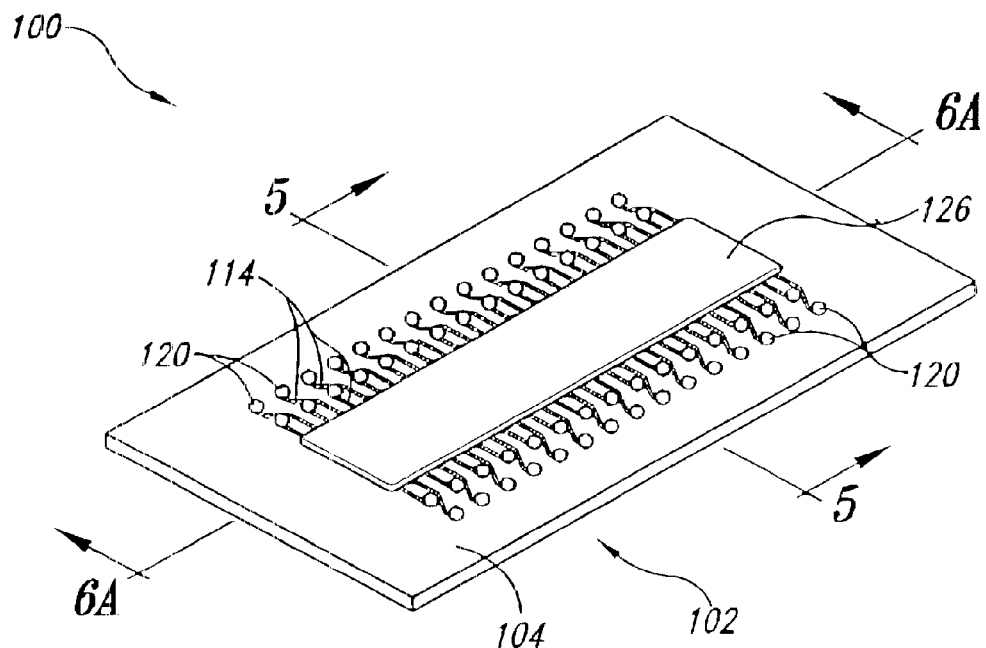
FIG. 3 is an upper isometric view of a microelectronics assembly in accordance with an embodiment of the invention.
Figure 4:
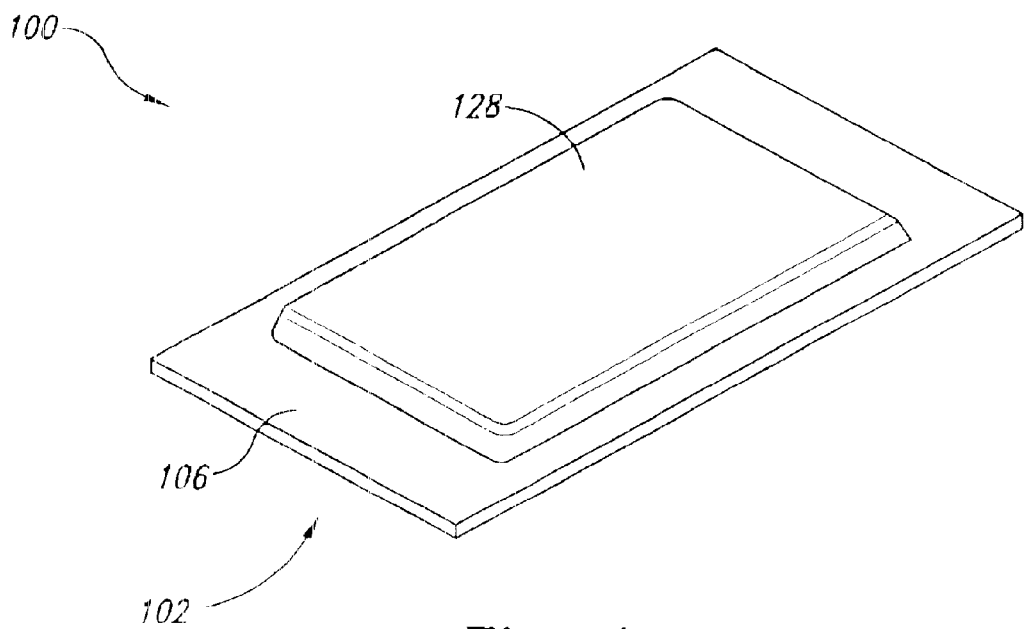
FIG. 4 is a lower isometric view of the microelectronics assembly of FIG. 3.

FIGS. 3 and 4 are upper and lower isometric views, respectively, of a microelectronics assembly 100 in accordance with an embodiment of the invention. FIG. 5 is an end cross-sectional view of the microelectronics assembly 100 of FIG. 3 viewed along line 5—5. As best shown in FIG. 5, the microelectronics assembly 100 includes an interposer 102 having a substrate 103 with an upper surface 104 and a lower surface 106. In this embodiment, both the upper and lower surfaces 104, 106 include a layer of solder mask. A wire-bonding slot 108 is disposed through the interposer 102. A die 110 is attached by a pair of adhesive strips 112 to the lower surface 106 of the interposer 102.

The substrate 103 of the interposer 102 may be formed from a variety of materials. Typically, substrate layers may be formed, for example, from any suitable dielectric thermoplastic materials, including elastomers, filled elastomers, polymers, or copolymers. Also, the upper and lower surfaces 104, 106 of the substrate 103 may include one or more layers of solder mask, as shown in, FIG. 5.

A plurality of conductive leads 114 are formed on the upper surface 104, each lead 114 having a first end 116 proximate the wire-bonding slot, 108 and a second end 118 having a conductive bump 120 (e.g. solder ball) formed thereon. The second ends 118 of the conductive leads 114 fan out from the wire-bonding slot 108. The conductive bumps 120 may be coupled to other electronic components, such as printed circuit. boards, electronics modules, and the like.

A plurality of conductive terminals 122 are formed on the die 110 proximate the wire-bonding slot 108. A plurality of bond wires, 124 extend between the conductive terminals 122 and the first ends 116 of the conductive leads 114, electrically coupling the die 110 with the conductive leads 114 of the interposer 102. An upper encapsulating portion 126 surrounds the bond wires 124, conductive terminals 122, and the first ends 116 of the conductive leads 114. A lower encapsulating portion 128 encloses the-die 110.

Figure 6B:
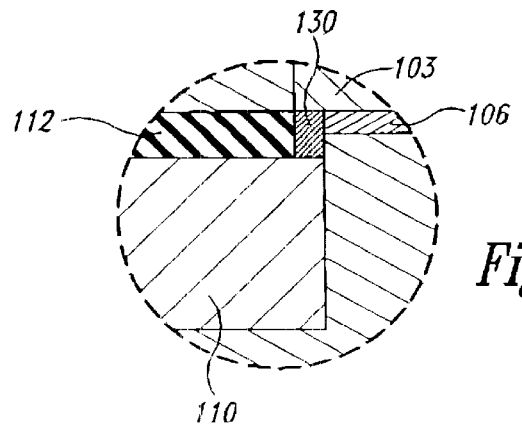
FIG. 6B is a enlarged side cross-sectional view of a diverter of the microelectronics assembly of FIG. 6A.
Figure 7:
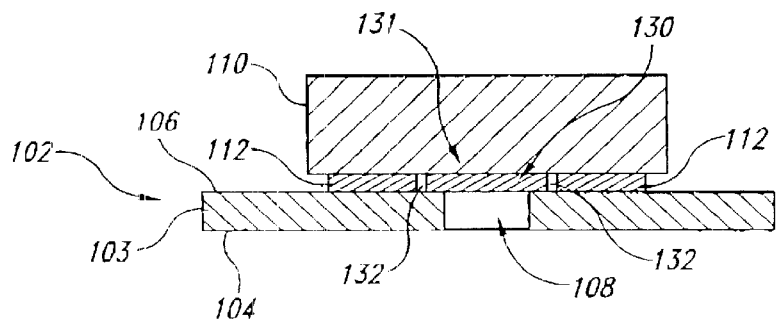
FIG. 7 is an enlarged, end cross-sectional view of a die and interposer subasse of FIG. 6A viewed along line 7—7.

FIG. 6A is a side cross-sectional view of the microelectronics assembly 100 of FIG. 3 viewed along line 6A—6A. FIG. 6B is an enlarged side cross-sectional view of a diverter 130 of the microelectronics assembly 100 of FIG. 6A. FIG. 7 is an enlarged end cross-sectional view of a die and interposer subassembly 144 of the microelectronics assembly 100 of FIG. 6A viewed along line 7—7. As best shown in FIG. 7, the interposer 102 includes a diverter 130 positioned between the adhesive strips 112 that attach the die 110 to the lower surface 106. In this embodiment, the diverter 130 spans a portion of the wire-bonding slot 108. Alternately, the diverter 130 may be positioned along an end of the wire-bonding slot 108.

As described more fully below, the diverter 130 projects from the first surface 106 of the substrate 103 toward a region adapted to be occupied by a semiconductor component (e.g. the die 110) and serves as an encapsulant fill control feature during the encapsulant fill process. The diverter 130 or other fill control feature redirects or diverts some or substantially all of the flow of encapsulant material into a space surrounding an outer portion of the die 110 prior to the encapsulant material filling the space between the die 110 and the interposer 102. After the space surrounding the outer or "die side" of the package is substantially filled, the encapsulant material flows between the die 110 and the interposer 102 and may substantially fill an inner or "wire side" of the die 110. By ensuring that the "die side" of the package and the "wire side" of the microelectronics assembly fill sequentially rather than simultaneously, the diverter 130 (or other fill control feature) may thereby improve the fill of encapsulant material around sensitive portions of the microelectronics assembly, including, for example, bond pads, contact pads, bond wires, solder bumps, or other components.

In the embodiment shown in FIG. 6B, the height of the diverter 130 is sized to match a thickness t of the adhesive strips 112 so that the diverter 130 contacts the die 110. The diverter 130 substantially blocks an opening 131 between the adhesive strips 112, the die 110 and the interposer 102. In this embodiment, the width of the diverter 130 is slightly less than the width of the opening 131 between the adhesive strips 112 so that a pair of first gaps 132 exist between the diverter 130 and the adhesive strips 112. Alternately, the diverter 130 may be sized to completely block the opening 131.

Figure 8:
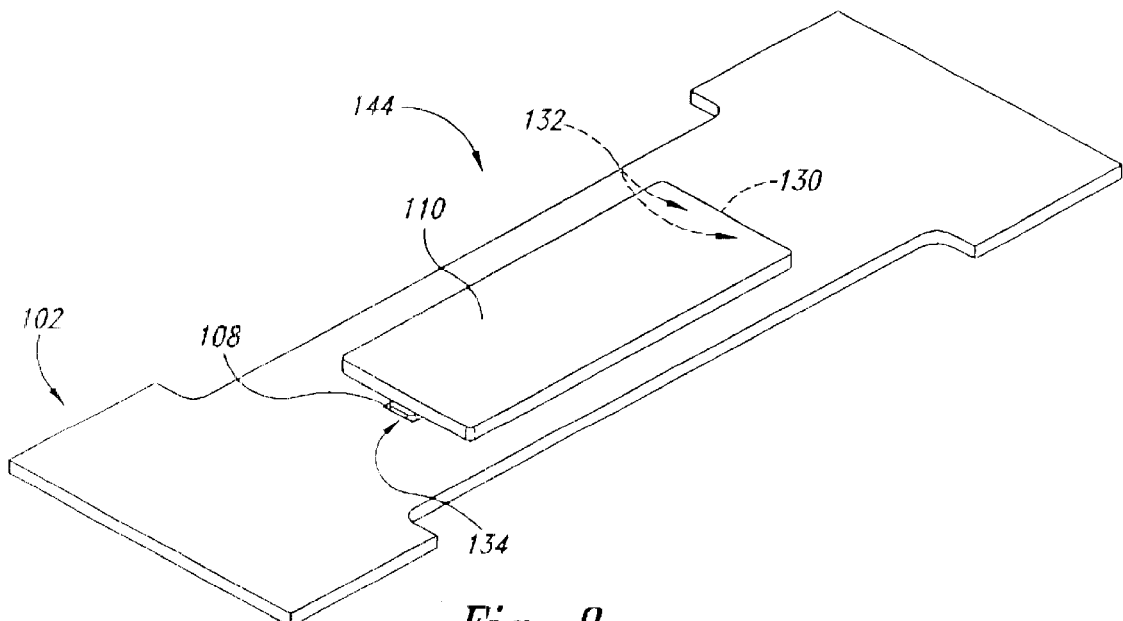
FIG. 8 is a lower isometric view of the die and interposer subassembly of the microelectronics assembly of FIG. 3.

During manufacture of the microelectronics assembly 100, the die 110 may first be attached to the interposer 102, as shown in FIG. 8. The wire-bonding slot 108 may be slightly longer than the die 110, forming a second gap 134. The bond wires 124 (see FIG. 5) may then be coupled between the conductive terminals 122 and the conductive leads 114 to form the die and interposer subassembly 144. The bond wires 124 may be attached, either manually or in using an automated wire bonder, in a variety of conventional ways, including, for example, using any of the 4500 Series manual wire bonders, or the 8000 Series automated wire bonders, available from Kulicke & Soffa Industries, Inc. of Willow Grove, Pennsylvania.

Figure 9:
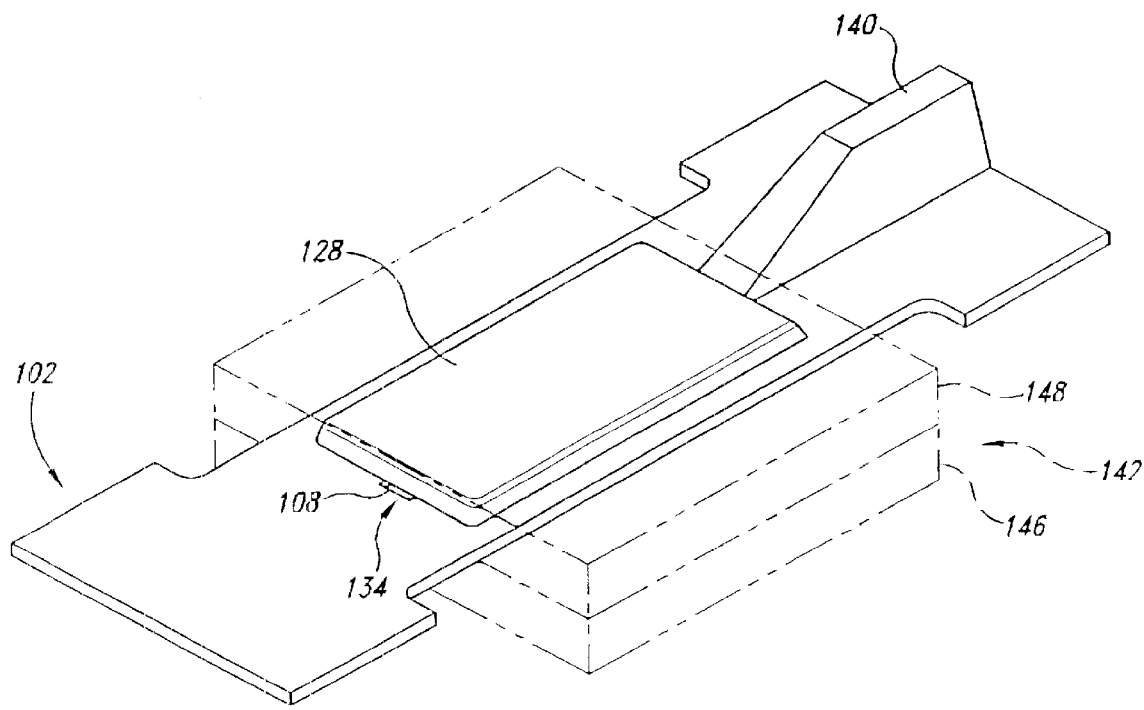
FIG. 9 is a lower isometric view of the die and interposer subassembly of FIG. 8 coupled to an encapsulant supplier and a mold.

After the die 110 is wire-bonded to the interposer 102, the upper and lower encapsulating layers 126, 128 are formed. FIG. 9 is a lower isometric view of the die and interposer subassembly 144 of FIG. 8 coupled to an encapsulant supplier 140. A mold 142 is positioned about the die and interposer subassembly 144 (also see FIG. 6A). The mold 142 includes an upper half 146 having a first inner surface spaced apart from the die and interposer subassembly 144 and shaped to form the upper encapsulating portion 126, and a lower half 148 having a second inner surface spaced apart from the die and interposer subassembly 144 and shaped to form the lower encapsulating portion 128. The encapsulant supplier 140 may be integrally formed with the lower half 148 of the mold 142.

Figure 10:
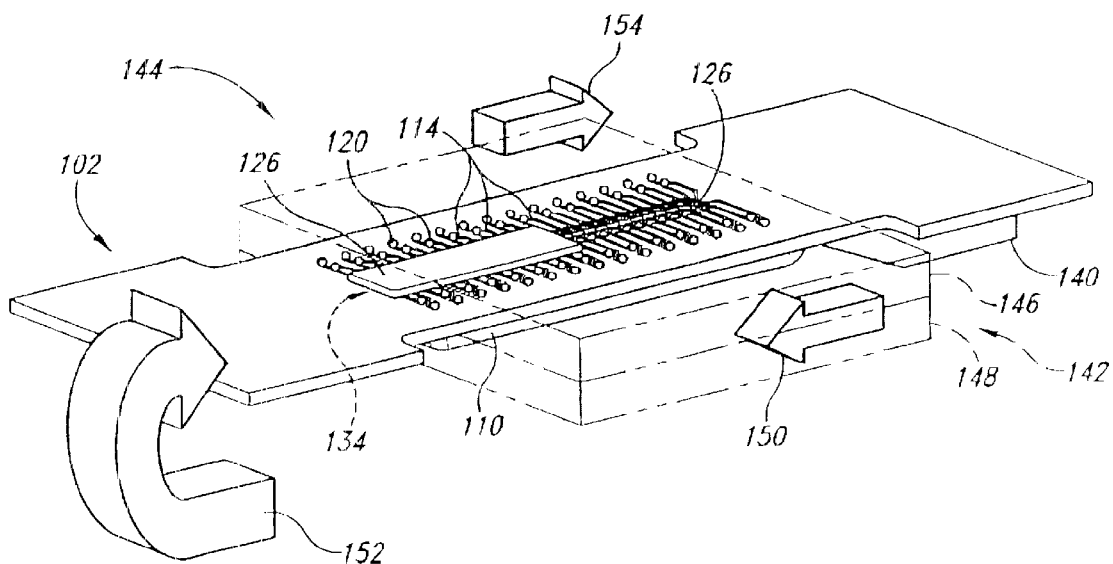
FIG. 10 is an upper isometric view of the die and interposer subassembly coupled with the encapsulant supplier and the mold of FIG. 9.

FIG. 10 is an upper isometric view of the die and interposer subassembly 144 of FIG. 9. As depicted in FIG. 10, to form the upper and lower encapsulating portions 126, 128, a fill process is initiated in which a flow of encapsulant material enters through the encapsulant supplier 140 at a first pressure $P_1$ and flows in a first direction 150. Because the diverter 130 blocks most of the opening 131 between the adhesive strips 112 (FIG. 7), substantially all of the flow of encapsulant material is diverted into the space between the lower half 148 of the mold 142 and the die and interposer subassembly 144. A small portion of the encapsulant material may flow through the first gaps 132 (FIG. 7) into the space between the upper half 146 and the die and interposer subassembly 144.

The flow of encapsulant material substantially fills the space between the lower half 148 and the die and interposer subassembly 144 at a second pressure $P_2$, forming the lower encapsulating portion 128. During the fill process, the second pressure $P_2$ is less than the first pressure $P_1$. The encapsulant material may then flow through the second gap 134, turning through a turn 152 and flowing back along the space between the upper half 146 of the mold 142 and the die and interposer subassembly 144 at a third pressure $P_3$. Again, during the fill process, the third pressure $P_3$ is less than the second pressure $P_2$. The flow of encapsulant material continues flowing in a second direction 154 in the space between the upper half 146 and the die and interposer subassembly 144, surrounding and covering the bond wires 124, the conductive terminals 122, and at least a portion of the first ends 116 of the conductive leads 114.

During the fill process, a fourth pressure $P_4$ in the space between the upper half 146 and the die and interposer subassembly 144 is less than the third pressure $P_3$. The fourth pressure $P_4$ may, for example, be a vacuum. Eventually, the flow of encapsulant material fills the space between the upper half 146 and the die and interposer subassembly 144 to form the upper encapsulating portion 126 (partially shown in FIG. 10), and the fill process is complete. The upper and lower encapsulating portions 126, 128 may then be cured, such as by heating, and the upper and lower halves 146, 148 of the mold 142, and the encapsulant supplier 140, may be removed.

An advantage of the interposer 102 having an encapsulant fill control feature such as the diverter 130 is that the space surrounding the die 110 between the lower half 148 and the die and interposer subassembly 144 (or "die side") is filled before the space between the upper half 146 and the die and interposer subassembly 144 (or "wire side"). The diverter 130 substantially eliminates the opening 131 that is created when the die 110 is attached with the adhesive strips 112. The diverter 130 ensures that the encapsulant material fills the die side of the microelectronics assembly 100 prior to filling the wire side. Because the die side is formed first, the second pressure $P_2$ prevents bleed of encapsulant material from the wire side to the die side. Thus, the upper encapsulating portion 126 may have fewer voids and improved fill around the bond wires and other portions of the assembly compared with prior microelectronics assemblies, resulting in fewer malfunctions.

One may note that the interposer 102 having the diverter 130 or other embodiments of an encapsulant fill control feature may be used when the die 110 is attached to the lower surface 106 using attachment devices other than adhesive strips. For example, the adhesive strips 112 may be eliminated, and the die 110 may be attached to the interposer 102 using, for example, an adhesive (e.g. epoxy), eutectic bonding, solder, or other suitable methods. Thus, an interposer having a diverter may be used with a variety of embodiments that have an opening between the die and the interposer that may be at least partially blocked using a diverter to achieve the desired diversion of encapsulating material during the fill of the encapsulant material.

Figure 11:
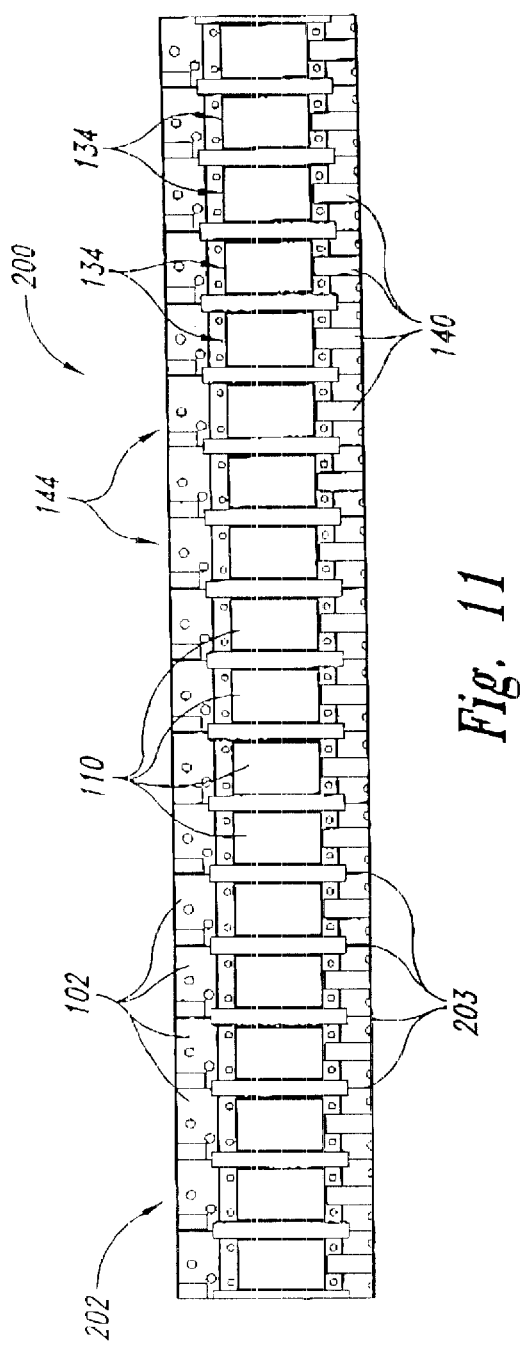
FIG. 11 is a lower plan view of a plurality of die and interposer subassemblies in accordance with an embodiment of the invention.
Figure 12:
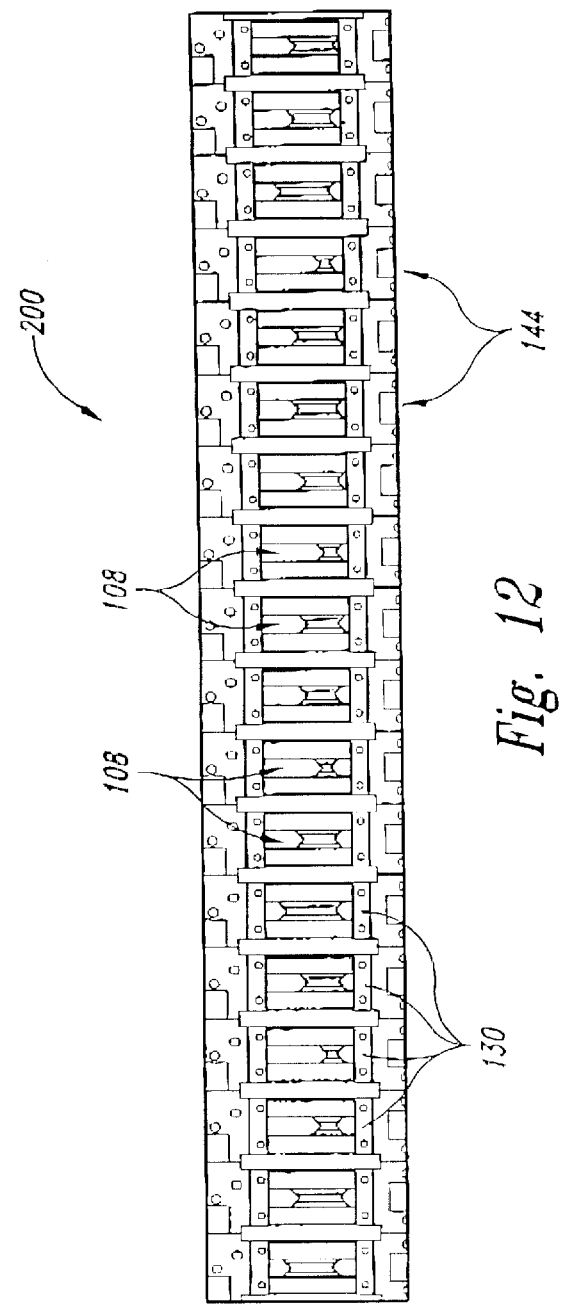
FIG. 12 is an upper plan view of the plurality of die and interposer subassembly of FIG. 11.

In an alternate embodiment, the above-described microelectronics assembly (and method of manufacturing same) may be mass-produced. For example, FIGS. 11 and 12 are lower and upper plan views, respectively, of a plurality of die and interposer subassemblies 200 in accordance with an embodiment of the invention. An interposer strip 202 includes a plurality of interposers 102 attached along singulation edges 203 of the interposers 102. As described above, each interposer 102 includes a wire-bonding slot 108 (FIG. 12). A plurality of die 110 are attached to the interposer strip 202, each die 110 being positioned over a corresponding wire-bonding slot 108. Each interposer 102 includes an encapsulant fill control feature 130 (e.g. a diverter 130) that substantially blocks the opening 131 (FIG. 7) formed between the adhesive strips 112, the die 110, and the interposer 102. Bond wires 124 are coupled between the conductive terminals 122 of each die 110 and the first ends 116 of the conductive leads 114 of each corresponding interposer 102 in the manner described above to form each die and interposer subassembly 144.

The plurality of die and interposer subassemblies 200 may then be positioned in a mold (not shown), and the upper and lower encapsulating portions 126, 128 (FIG. 5) may be formed simultaneously over each of the die and interposer subassemblies 144 as described above to form a plurality of microelectronics assemblies 100 (FIGS. 3 and 4). After the upper and lower encapsulating portions 126, 128 are formed, the microelectronics assemblies 100 may be singulated by parting (e.g. cutting, sawing, breaking, etc.) the interposers 102 along the singulation edges 203. Thus, the advantages of the interposer 102 having the diverter 130 may be achieved in the interposer strip 202, allowing bulk production of the microelectronics assemblies 100 having improved encapsulation characteristics.

Figure 13:
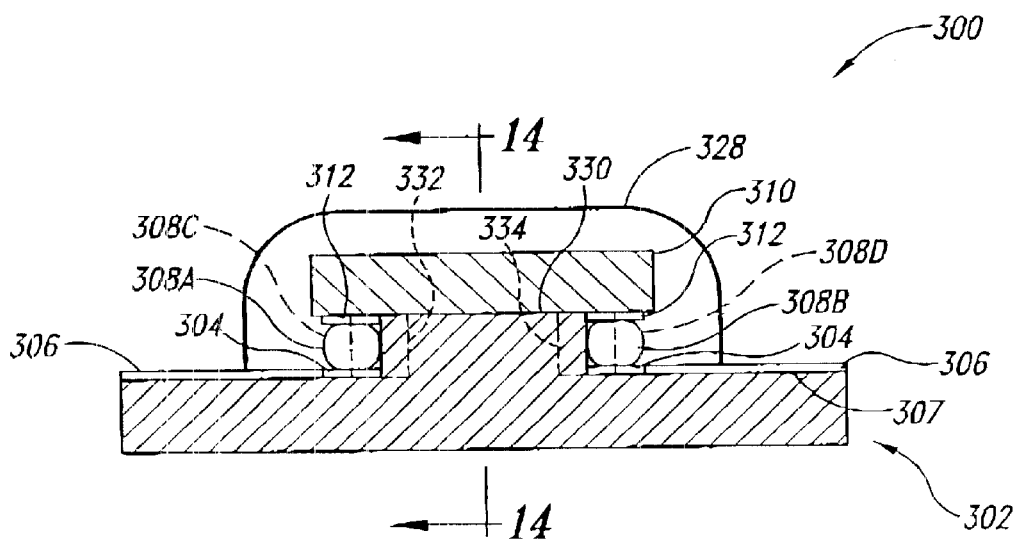
FIG. 13 is an end cross-sectional view of a microelectronics assembly having a plurality of encapsulant fill control features in accordance with an alternate embodiment of the invention.
Figure 14:
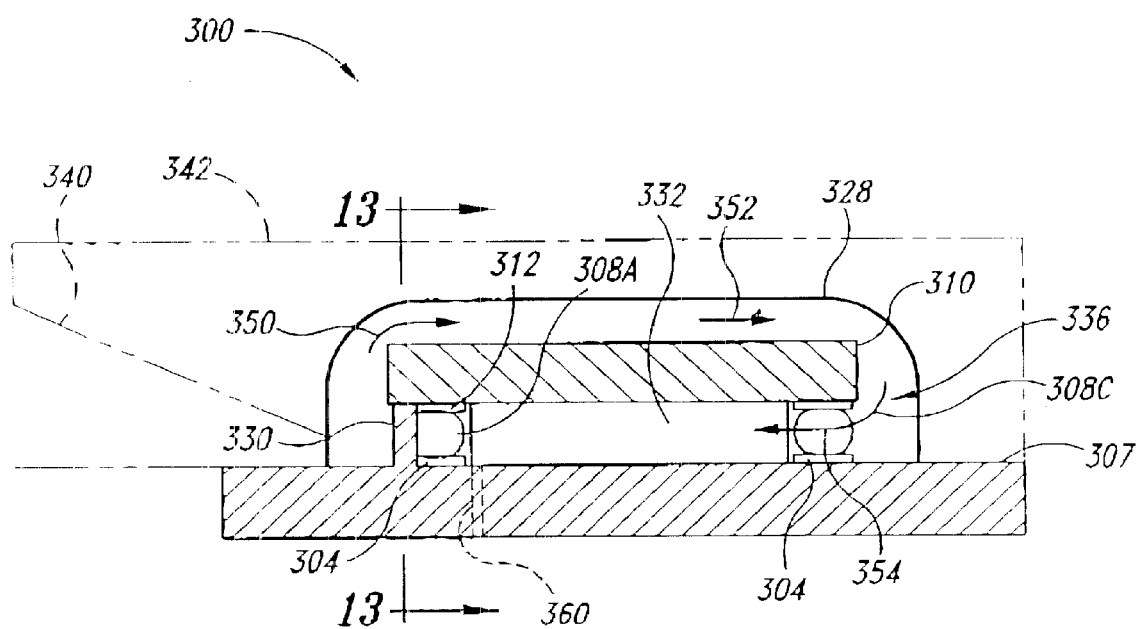
FIG. 14 is a side cross-sectional view of the microelectronics assembly of FIG. 13 viewed along line 14—14.

FIGS. 13 and 14 are end and side cross-sectional views, respectively, of a microelectronics assembly 300 having a plurality of encapsulant fill control features in accordance with an alternate embodiment of the invention. The microelectronics assembly 300 includes a die 310 having a plurality of bond pads 312 formed thereon, and an interposer 302 having a corresponding plurality of contact pads 304. Each contact pad 312 is coupled to the corresponding contact pad 304 by a solder bump 308A, 308B, 308C, and 308D (not shown). A plurality of leads 306 are disposed on an upper surface 307 of the interposer 302, each lead 306 being coupled to a contact pad 312.

The interposer 302 also includes a first fill control wall 330 (FIG. 13) positioned between solder bump 308A and solder bump 308B, a second fill control wall 332 (FIG. 14) positioned between solder bump 308A and solder bump 308C, and a third fill control wall 334 (shown in end view in FIG. 13) positioned between solder bump 308B and 308D. As shown in FIG. 14, a fill gate 336 is formed between the die 310, the interposer 302, and solder bumps 308C and 308D. An encapsulating layer 328 is formed over the die 310.

During manufacture of the microelectronics assembly 300, a mold 342 (FIG. 14) is positioned over the die 110 and is engaged against the upper surface 307 of the interposer 302. The interior of the mold and the microelectronics assembly 300 may be subjected to vacuum. Alternately, an exhaust port 360 may be disposed in the interposer 302 to permit air to be exhausted from the mold 342 during the fill process.

As best seen in FIG. 14, a flow of encapsulant material enters the mold 342 via a runner 340 and encounters the first fill control wall 330. The first fill control wall 330 redirects most or substantially all of the flow of encapsulant material in a first direction 350 upwardly, where it begins to fill the space over and surrounding the die 310, forming the encapsulating layer 328 (FIG. 13).

As the flow of encapsulant material continues in a second direction 352, some of the encapsulant material flows along the sides of the die 310 and encounters the second and third fill control wall 332, 334. The second and third fill control walls 332, 334 prevent the encapsulant material from initially entering the space between the die 310 and the interposer 302 until the flow of encapsulant reaches the fill gate 336. As the flow of encapsulant material reaches the end of the die 310, it turns in a third direction 354, flows through the fill gate 336, and may substantially fill the "wire side" space between the die 310 and the interposer 302.

The interposer 302 having the first, second, and third fill control walls 330, 332, 334 advantageously ensures that the encapsulant material fills the die side of the microelectronics assembly 300 prior to filling the space between the die 310 and the interposer 302. Because the upper side of the die is filled before the lower side of the die, the pressure within the mold on the upper side of the die, and the second and third fill control walls 332, 334, substantially prevent bleed of encapsulant material from the lower side to the upper side. This may reduce the number of voids and may improve the fill of encapsulant material around the solder bumps, contact pads, bond pads, and other portions of the assembly compared with prior microelectronics assemblies.

One may note that a variety of alternate embodiments may be conceived. For example, the solder bumps 308 may be eliminated, and the bond pads 312 may be attached directly to the contact pads 304. Alternately, the die 310 may be attached to the interposer 302 using adhesive strips 112 or a suitable epoxy. The die 310 could be inverted with its bond pads 312 facing away from the interposer 302, and the bond pads 312 could be wire-bonded to the contact pads 304 using bond wires 124. Furthermore, the solder bumps 308 (or the adhesive strips 112 described above) may be replaced with any suitable isotropically or an isotropically conductive adhesive, as disclosed, for example, in U.S. Pat. No. 6,002,180 to Akram et al, incorporated herein by reference. Suitable isotropically and an isotropically conductive materials are commercially-available from, for example, Ablestik of Rancho Dominguez, Calif., or A.I. Technology, Inc. of Trenton, N.J., or Sheldahl, Inc. of Northfield, Minn., or 3M of St. Paul, Minn.

The detailed descriptions of the above embodiments are not exhaustive descriptions of all embodiments contemplated by the inventors to be within the scope of the invention. Indeed, persons skilled in the art will recognize that certain elements of the above-described embodiments may variously be combined or eliminated to create further embodiments, and such further embodiments fall within the scope and teachings of the invention. It will also be apparent to those of ordinary skill in the art that the above-described embodiments may be combined in whole or in part to create additional embodiments within the scope and teachings of the invention.

Thus, although specific embodiments of, and examples for, the invention are described herein for illustrative purposes, various equivalent modifications are possible within the scope of the invention, as those skilled in the relevant art will recognize. The teachings provided herein can be applied to other resistance-reducing conductive adhesives, and to other apparatus and methods of semiconductor component packaging using interposers having an encapsulant fill control feature, and not just to the embodiments described above and shown in the accompanying figures. Accordingly, the scope of the invention should be determined from the following claims.

What is claimed is:

1. An interposer adapted for attaching a semiconductor component to a circuit board, comprising:

a substrate having a first surface proximate to a region adapted to be occupied by the semiconductor component, and a second surface adapted to engage the circuit board; and a diverter projecting from the first surface toward the region, the diverter being positionable between the region and the substrate and being sized to at least partially block an opening between the region and the first surface, wherein the region is adapted to be occupied by the semiconductor component when the semiconductor component is attached to the first surface by a pair of adhesive strips, the opening being formed between the region, the first surface, and the adhesive strips.

2. The interposer according to claim 1 wherein the diverter completely blocks the opening between the region and the first surface.

3. The interposer according to claim 1 wherein the region is adapted to be occupied by the semiconductor component when the semiconductor component is attached to the first surface by a pair of conductive bumps, the opening being formed between the region, the first surface, and the conductive bumps.

4. The interposer according to claim 1 wherein the substrate has an aperture disposed therethrough.

5. The interposer according to claim 4, wherein the aperture comprises a slot.

6. The interposer according to claim 4, wherein the diverter is proximate at least a portion of the aperture.

7. The interposer according to claim 1 wherein the diverter is integrally formed on the first surface of the substrate.

8. The interposer according to claim 1 wherein the interposer includes a plurality of conductive leads formed on the second surface.

9. The interposer according to claim 1 wherein the interposer includes a plurality of conductive bumps formed on the second surface.

10. The interposer according to claim 1 wherein the substrate comprises an elastomer layer.

11. The interposer according to claim 1 wherein the substrate comprises a polymer layer.

12. A microelectronics assembly, comprising:
   a semiconductor component having a plurality of conductive terminals;
   an interposer having a first surface attached to the semiconductor component and a second surface having a plurality of conductive leads formed thereon;
   a fill control feature projecting from the first surface toward the semiconductor component, the fill control feature being positioned at least partially between the semiconductor component and the first surface and being sized to at least partially block an opening between the semiconductor component and the first surface;
   a plurality of conductive members electrically coupled between the conductive terminals and the conductive leads; and
   an encapsulant disposed at least partially over the semiconductor component and the plurality of conductive members, wherein the semiconductor component is attached to the first surface by a pair of adhesive strips, the opening being formed between the semiconductor component, the first surface, and the adhesive strips.

13. The microelectronics assembly according to claim 12 wherein the fill control feature substantially blocks the opening between the semiconductor component and the first surface.

14. The microelectronics assembly according to claim 12 wherein the semiconductor component is attached to the first surface by a pair of conductive bumps, the opening being formed between the semiconductor component, the first surface, and the conductive bumps.

15. The microelectronics assembly according to claim 12 wherein the interposer has an aperture disposed therethrough.

16. The microelectronics assembly according to claim 15 wherein the aperture comprises a slot.

17. The microelectronics assembly according to claim 15 wherein the fill control feature is proximate at least a portion of the aperture.

18. The microelectronics assembly according to claim 15 wherein the conductive members are at least partially disposed within the aperture.

19. The microelectronics assembly according to claim 12 wherein the fill control feature is integrally formed on the first surface of the interposer.

20. The microelectronics assembly according to claim 12 wherein the fill control feature comprises a first fill control feature and the opening comprises a first opening, further comprising a second fill control feature projecting from the first surface toward the semiconductor component, the second fill control feature being positioned between the semiconductor component and the first surface and being sized to at least partially block a second opening between the semiconductor component and the first surface.

21. The microelectronics assembly according to claim 12 wherein the semiconductor component comprises a die.

22. The microelectronics assembly according to claim 12, further comprising a circuit board coupled to the plurality of conductive leads.

23. An interposer adapted for attaching a semiconductor component to a circuit board, comprising:
   a substrate having a first surface proximate to a region adapted to be occupied by the semiconductor component, and a second surface adapted to engage the circuit board; and
   a diverter integrally formed on the first surface of the substrate and projecting from the first surface toward the region, the diverter being positionable between the region and the substrate and being sized to at least partially block an opening between the region and the first surface.

24. The interposer according to claim 23 wherein the diverter completely blocks the opening between the region and the first surface.

25. The interposer according to claim 23 Wherein the region is adapted to be occupied by the semiconductor component when the semiconductor component is attached to the first surface by a pair of adhesive strips, the opening being formed between the region, the first surface, and the adhesive strips.

26. The interposer according to claim 23 wherein the region is adapted to be occupied by the semiconductor component when the semiconductor component is attached to the first surface by a pair of conductive bumps, the opening being formed between the region, the first surface, and the conductive bumps.

27. The interposer according to claim 23 wherein the substrate has an aperture disposed therethrough.

28. The interposer according to claim 27 wherein the aperture comprises a slot.

29. The interposer according to claim 27 wherein the diverter is proximate at least a portion of the aperture.

30. The interposer according to claim 23 wherein the interposer includes a plurality of conductive leads formed on the second surface.

31. The interposer according to claim 23 wherein the interposer includes a plurality of conductive bumps formed on the second surface.

32. The interposer according to claim 23 wherein the substrate comprises an elastomer layer.

33. The interposer according to claim 23 wherein the substrate comprises a polymer layer.

34. An interposer adapted for attaching a semiconductor component to a circuit board, comprising:
   a substrate comprising an elastomer layer and having a first surface proximate to a region adapted to be occupied by the semiconductor component, and a second surface adapted to engage the circuit board; and
   a diverter projecting from the first surface toward the region, the diverter being positionable between the region and the substrate and being sized to at least partially block an opening between the region and the first surface.

35. The interposer according to claim 34 wherein the diverter completely blocks the opening between the region and the first surface.

36. The interposer according to claim 34 wherein the region is adapted to be occupied by the semiconductor component when the semiconductor component is attached to the first surface by a pair of adhesive strips, the opening being formed between the region, the first surface, and the adhesive strips.

37. The interposer according to claim 34 wherein the region is adapted to be occupied by the semiconductor component when the semiconductor component is attached to the first surface by a pair of conductive bumps, the opening being formed between the region, the first surface, and the conductive bumps.

38. The interposer according to claim 34 wherein the substrate has an aperture disposed therethrough.

39. The interposer according to claim 38 wherein the aperture comprises a slot.

40. The interposer according to claim 38 wherein the diverter is proximate at least a portion of the aperture.

41. The interposer according to claim 34 wherein the interposer includes a plurality of conductive leads formed on the second surface.

42. The interposer according to claim 34 wherein the interposer includes a plurality of conductive bumps formed on the second surface.

43. The interposer according to claim 34 wherein the diverter is integrally formed on the first surface of the substrate.

44. The interposer according to claim 34 wherein the substrate comprises a polymer layer.

45. A microelectronics assembly, comprising:
   a semiconductor component having a plurality of conductive terminals;
   an interposer having a first surface attached to the semiconductor component and a second surface having a plurality of conductive leads formed thereon;
   a fill control feature integrally formed on the first surface of the interposer and projecting from the first surface toward the semiconductor component, the fill control feature being positioned at least partially between the semiconductor component and the first surface and being sized to at least partially block an opening between the semiconductor component and the first surface;
   a plurality of conductive members electrically coupled between the conductive terminals and the conductive leads; and
   an encapsulant disposed at least partially over the semiconductor component and the plurality of conductive members.

46. The microelectronics assembly according to claim 45 wherein the fill control feature substantially blocks the opening between the semiconductor component and the first surface.

47. The microelectronics assembly according to claim 45 wherein the semiconductor component is attached to the first surface by a pair of adhesive strips, the opening being formed between the semiconductor component, the first surface, and the adhesive strips.

48. The microelectronics assembly according to claim 45 wherein the semiconductor component is attached to the first surface by a pair of conductive bumps, the opening being formed between the semiconductor component, the first surface, and the conductive bumps.

49. The microelectronics assembly according to claim 45 wherein the interposer has an aperture disposed therethrough.

50. The microelectronics assembly according to claim 49 wherein the aperture comprises a slot.

51. The microelectronics assembly according to claim 49 wherein the fill control feature is proximate at least a portion of the aperture.

52. The microelectronics assembly according to claim 49 wherein the conductive members are at least partially disposed within the aperture.

53. The microelectronics assembly according to claim 45 wherein the fill control feature comprises a first fill control feature and the opening comprises a first opening, further comprising a second fill control feature projecting from the first surface toward the semiconductor component, the second fill control feature being positioned between the semiconductor component and the first surface and being sized to at least partially block a second opening between the semiconductor component and the first surface.

54. The microelectronics assembly of claim 45 wherein the semiconductor component comprises a die.

55. The microelectronics assembly of claim 45 further comprising a circuit board coupled to the plurality of conductive leads.

56. A microelectronics assembly, comprising:
   a semiconductor component having a plurality of conductive terminals;
   an interposer having a first surface attached to the semiconductor component and a second surface having a plurality of conductive leads formed thereon;
   a first fill control feature projecting from the first surface toward the semiconductor component, the first fill control feature being positioned at least partially between the semiconductor component and the first surface and being sized to at least partially block a first opening between the semiconductor component and the first surface;
   a second fill control feature projecting from the first surface toward the semiconductor component, the second fill control feature being positioned between the semiconductor component and the first surface and being sized to at least partially block a second opening between the semiconductor component and the first surface;
   a plurality of conductive members electrically coupled between the conductive terminals and the conductive leads; and
   an encapsulant disposed at least partially over the semiconductor component and the plurality of conductive members.

57. The microelectronics assembly according to claim 56 wherein at least one of the first and second fill control features substantially blocks a respective one of the first and second openings between the semiconductor component and the first surface.

58. The microelectronics assembly according to claim 56 wherein the semiconductor component is attached to the first surface by a pair of adhesive strips, the first and second openings being formed between the semiconductor component, the first surface, and the adhesive strips.

59. The microelectronics assembly according to claim 56 wherein the semiconductor component is attached to the first surface by a pair of conductive bumps, the first and second openings being formed between the semiconductor component, the first surface, and the conductive bumps.

60. The microelectronics assembly according to claim 56 wherein at least one of the first and second fill control features is integrally formed with the first surface.

61. The microelectronics assembly of claim 56 wherein the semiconductor component comprises a die.

62. The microelectronics assembly of claim 56, further comprising a circuit board coupled to the plurality of conductive leads.

63. A method of fabricating a microelectronics assembly, comprising:

providing an interposer having a first surface and a semiconductor component positioned at least proximate the first surface in a manner that forms an opening between the first surface and the semiconductor component, the semiconductor component having an outer side substantially opposite from the interposer and an inner side proximate the first surface;

flowing an encapsulant material at least partially about the semiconductor component and the interposer proximate the opening; and at least partially diverting the encapsulant material away from the opening and at least partially about the outer side of the semiconductor component.

64. The method according to claim 63, further comprising attaching the semiconductor component to the first surface.

65. The method according to claim 64 wherein attaching the semiconductor component to the first surface comprises attaching the semiconductor component to the first surface using a pair of adhesive strips.

66. The method according to claim 64 wherein the semiconductor component includes a plurality of conductive terminals and the first surface includes a plurality of contact pads, and wherein attaching a semiconductor component to the first surface comprises attaching the plurality of conductive terminals to the plurality of contact pads using a plurality of conductive bumps.

67. The method according to claim 63 wherein the semiconductor component includes a plurality of conductive terminals and the interposer includes a plurality of conductive leads, further comprising electrically coupling a plurality of conductive members between the conductive terminals and the conductive leads.

68. The method according to claim 67 wherein the interposer includes an aperture disposed therethrough and a second surface, the plurality of conductive leads being disposed on the second surface, and wherein electrically coupling a plurality of conductive members between the conductive terminals and the conductive leads comprises wire-bonding a plurality of bond wires between the conductive terminals and the conductive leads.

69. The method according to claim 63, further comprising curing the encapsulant material.

70. The method according to claim 63 further comprising positioning a mold at least partially about the semiconductor component and the interposer.

71. The method according to claim 70, further comprising reducing a pressure within the mold and at least partially about the semiconductor component and the interposer.

72. The method according to claim 71 wherein reducing a pressure within the mold and at least partially about the semiconductor component and the interposer comprises creating a vacuum within the mold and at least partially about the semiconductor component and the interposer.

73. The method according to claim 63 wherein the interposer comprises a first interposer, further comprising singulating a second interposer from the first interposer along a singulation edge.

74. The method according to claim 63 wherein at least partially diverting the encapsulant material away from the opening comprises substantially blocking the opening such that a diverted stream of encapsulant substantially surrounds the outer side of the semiconductor component.

75. The method according to claim 63 wherein at least partially diverting the encapsulant material away from the opening comprises diverting at least some of the encapsulant material to substantially surround the outer side of the semiconductor component, further comprising substantially surrounding the inner side of the semiconductor component after substantially surrounding the outer side of the semiconductor component.

* * * * *

UNITED STATES PATENT AND TRADEMARK OFFICE
CERTIFICATE OF CORRECTION

PATENT NO. : 6,531,763 B1  Page 1 of 1
DATED : March 11, 2003
INVENTOR(S) : Todd O. Bolken et al.

It is certified that error appears in the above-identified patent and that said Letters Patent is hereby corrected as shown below:

<u>Title page,</u>
Item [75], Inventors, reads "David J. Corisis, Meridian, ID" should read
-- David J. Corisis, Nampa, ID --

<u>Column 3,</u>
Line 21, reads "and interposer subasse" should read -- and interposer subassembly --

<u>Column 8,</u>
Lines 13 and 16, reads "an isotropically" should read -- anisotropically --

Signed and Sealed this

Twenty-seventh Day of January, 2004

JON W. DUDAS
*Acting Director of the United States Patent and Trademark Office*